(12) United States Patent
Kanaya

(10) Patent No.: US 10,043,852 B2
(45) Date of Patent: Aug. 7, 2018

(54) MAGNETORESISTIVE MEMORY DEVICE AND MANUFACTURING METHOD OF THE SAME

(71) Applicant: TOSHIBA MEMORY CORPORATION, Minato-ku, Tokyo (JP)

(72) Inventor: Hiroyuki Kanaya, Seoul (KR)

(73) Assignee: TOSHIBA MEMORY CORPORATION, Tokyo (JP)

( * ) Notice: Subject to any disclaimer, the term of this patent is extended or adjusted under 35 U.S.C. 154(b) by 50 days.

(21) Appl. No.: 15/068,159

(22) Filed: Mar. 11, 2016

(65) Prior Publication Data

US 2017/0047375 A1     Feb. 16, 2017

Related U.S. Application Data

(60) Provisional application No. 62/203,664, filed on Aug. 11, 2015.

(51) Int. Cl.
| | |
|---|---|
| *H01L 27/22* | (2006.01) |
| *H01L 43/02* | (2006.01) |
| *H01L 43/08* | (2006.01) |
| *H01L 23/528* | (2006.01) |
| *H01L 43/12* | (2006.01) |
| *G11C 11/16* | (2006.01) |

(52) U.S. Cl.
CPC .......... *H01L 27/228* (2013.01); *H01L 23/528* (2013.01); *H01L 43/02* (2013.01); *H01L 43/08* (2013.01); *H01L 43/12* (2013.01); *G11C 11/1659* (2013.01)

(58) Field of Classification Search
CPC ......... H01L 43/12; H01L 43/08; H01L 43/02; H01L 27/228; H01L 27/226; H01L 27/222; H01L 27/22; H01L 23/528; H01L 23/5228; H01L 23/5226; H01L 23/522; G11C 11/1659; G11C 11/161; G11C 11/16

See application file for complete search history.

(56) References Cited

U.S. PATENT DOCUMENTS

| | | | | |
|---|---|---|---|---|
| 7,002,827 | B1 * | 2/2006 | Sabharwal | G11C 17/12 257/E21.668 |
| 7,575,984 | B2 * | 8/2009 | Radigan | H01L 27/1021 438/131 |
| 7,811,916 | B2 * | 10/2010 | Herner | H01L 21/2236 257/E21.141 |
| 7,821,086 | B2 * | 10/2010 | Kajiyama | G11C 11/16 257/421 |
| 8,031,519 | B2 * | 10/2011 | Javerliac | G11C 5/063 365/171 |

(Continued)

FOREIGN PATENT DOCUMENTS

JP         04188753 A     7/1992

*Primary Examiner* — Earl Taylor
(74) *Attorney, Agent, or Firm* — Holtz, Holtz & Volek PC

(57) ABSTRACT

According to one embodiment, a magnetoresistive memory device includes first electrodes located in an interlayer insulating film, second electrodes located on the respective first electrodes within the interlayer insulating film, magnetoresistive effect elements on the respective second electrodes, and third electrodes on the respective magnetoresistive effect elements. The first electrodes and the second electrodes are displaced from each other.

9 Claims, 12 Drawing Sheets

(56) References Cited

U.S. PATENT DOCUMENTS

| | | | | |
|---|---|---|---|---|
| 8,524,511 B1* | 9/2013 | Zhong | H01L 43/08 | 257/421 |
| 8,779,538 B2* | 7/2014 | Chen | G01R 33/098 | 257/3 |
| 8,790,935 B1* | 7/2014 | Nagel | H01L 21/76898 | 365/158 |
| 8,796,042 B2* | 8/2014 | Shin | H01L 27/228 | 257/E43.006 |
| 8,803,324 B2* | 8/2014 | Lee | H01L 21/76883 | 257/664 |
| 8,877,522 B2* | 11/2014 | Nagel | H01L 21/76898 | 365/158 |
| 8,940,634 B2* | 1/2015 | Engel | H01L 21/76895 | 257/764 |
| 8,946,837 B2* | 2/2015 | Watanabe | H01L 43/08 | 257/421 |
| 9,105,572 B2* | 8/2015 | Kanaya | H01L 27/222 | |
| 9,123,575 B1* | 9/2015 | Satoh | H01L 27/2436 | |
| 9,385,304 B2* | 7/2016 | Nakayama | H01L 43/02 | |
| 9,431,602 B2* | 8/2016 | Nagel | H01L 43/12 | |
| 9,627,609 B2* | 4/2017 | Jeong | H01L 43/12 | |
| 9,705,076 B2* | 7/2017 | Nagamine | H01L 43/10 | |
| 2004/0266206 A1* | 12/2004 | Cleeves | H01L 21/76885 | 438/719 |
| 2005/0224854 A1* | 10/2005 | Park | H01L 21/76895 | 257/296 |
| 2006/0054962 A1* | 3/2006 | Dunton | G11C 5/02 | 257/313 |
| 2007/0121391 A1* | 5/2007 | Gogl | G11C 11/16 | 365/189.09 |
| 2008/0203503 A1* | 8/2008 | Asao | H01L 27/228 | 257/421 |
| 2009/0154224 A1* | 6/2009 | Kajiyama | G11C 11/16 | 365/158 |
| 2009/0251949 A1* | 10/2009 | Xia | G11C 5/063 | 365/158 |
| 2010/0032725 A1* | 2/2010 | Baba | G11C 13/0007 | 257/211 |
| 2010/0072566 A1* | 3/2010 | Kang | H01L 43/08 | 257/422 |
| 2010/0265749 A1* | 10/2010 | Wang | H01L 27/228 | 365/51 |
| 2011/0278527 A1* | 11/2011 | Ishibashi | H01L 21/76805 | 257/1 |
| 2012/0063222 A1* | 3/2012 | Yamane | G11C 11/16 | 365/173 |
| 2012/0163070 A1* | 6/2012 | Nagase | B82Y 25/00 | 365/158 |
| 2012/0276711 A1* | 11/2012 | Yoon | H01L 21/764 | 438/421 |
| 2012/0286339 A1* | 11/2012 | Asao | H01L 27/228 | 257/295 |
| 2013/0009259 A1* | 1/2013 | Watanabe | H01L 27/228 | 257/421 |
| 2013/0015541 A1* | 1/2013 | Kanaya | H01L 43/08 | 257/421 |
| 2013/0113111 A1* | 5/2013 | Lee | H01L 21/76883 | 257/774 |
| 2014/0319590 A1* | 10/2014 | Nakatsuka | H01L 27/228 | 257/295 |
| 2015/0061053 A1* | 3/2015 | Nakayama | H01L 43/10 | 257/421 |
| 2015/0069554 A1* | 3/2015 | Nakayama | H01L 27/222 | 257/421 |
| 2015/0228889 A1* | 8/2015 | Yamane | H01L 43/02 | 257/421 |
| 2015/0270481 A1* | 9/2015 | Annunziata | H01L 43/08 | 257/421 |
| 2015/0295012 A1* | 10/2015 | Ito | H01L 27/2463 | 257/4 |
| 2016/0072052 A1* | 3/2016 | Noma | H01L 43/10 | 257/421 |
| 2016/0086882 A1* | 3/2016 | Lee | H01L 23/535 | 257/773 |
| 2016/0163971 A1* | 6/2016 | Jeong | H01L 43/12 | 438/3 |
| 2017/0025354 A1* | 1/2017 | Watanabe | H01L 21/76883 | |
| 2017/0047375 A1* | 2/2017 | Kanaya | H01L 27/228 | |
| 2017/0069826 A1* | 3/2017 | Wang | G11C 11/1659 | |

* cited by examiner

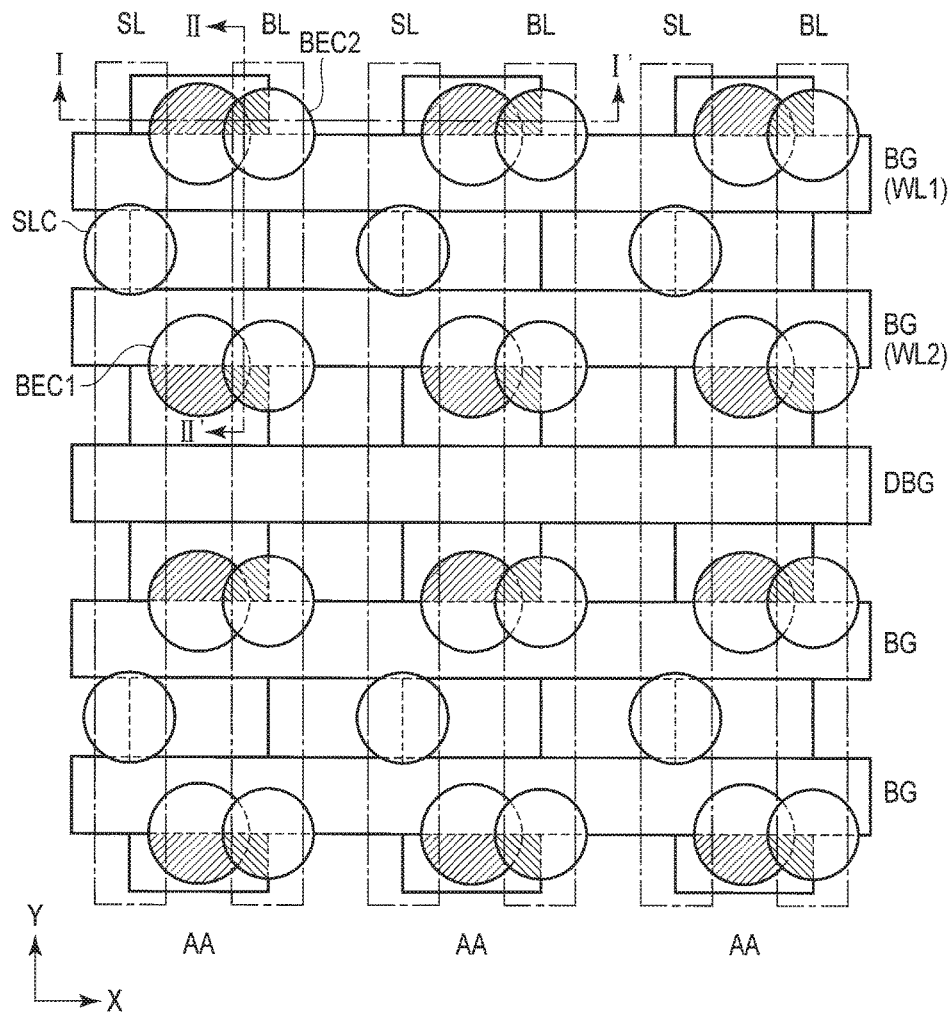
F I G. 4

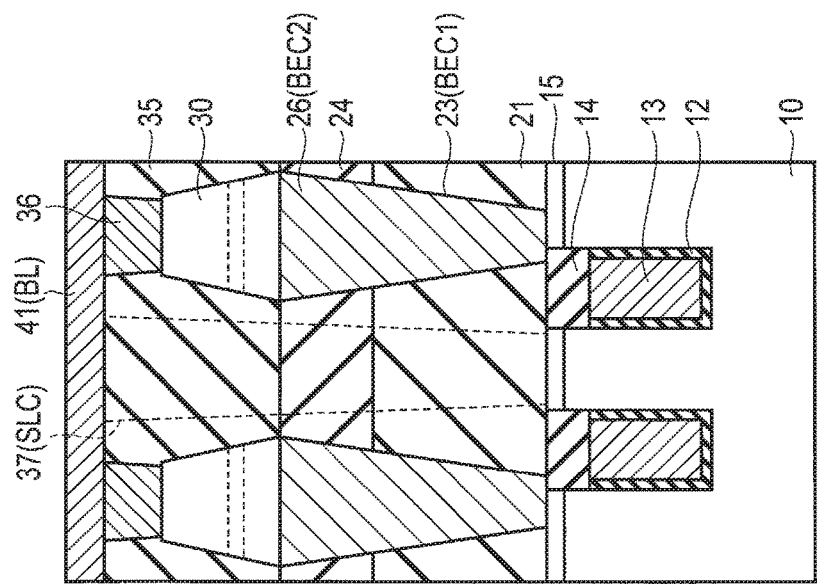
F I G. 5A
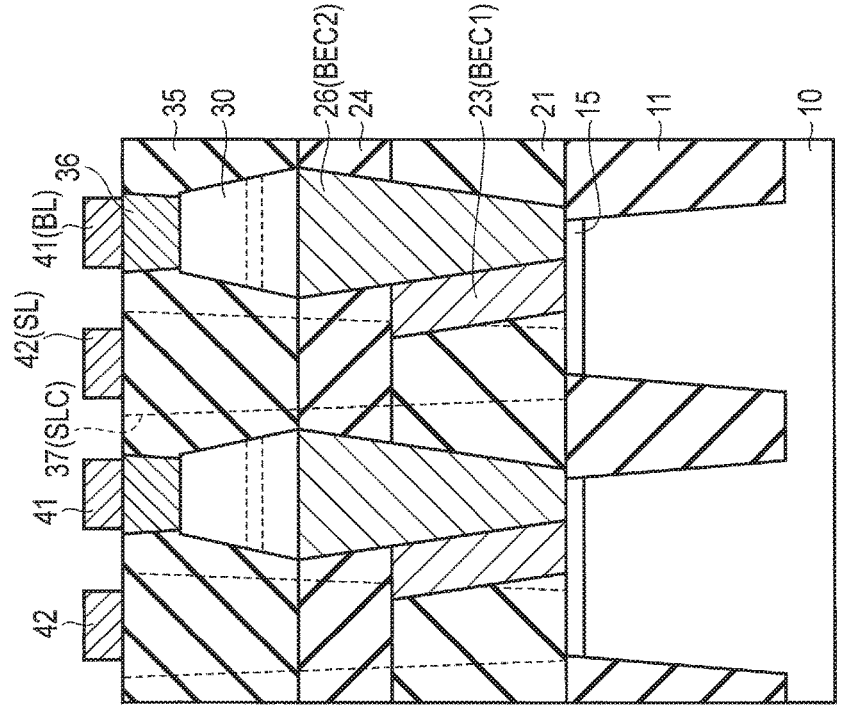
F I G. 5B

MAGNETORESISTIVE MEMORY DEVICE AND MANUFACTURING METHOD OF THE SAME

CROSS-REFERENCE TO RELATED APPLICATIONS

This application claims the benefit of U.S. Provisional Application No. 62/203,664, filed Aug. 11, 2015, the entire contents of which are incorporated herein by reference.

FIELD

Embodiments described herein relate generally to magnetoresistive memory devices and a method of manufacturing them.

BACKGROUND

In recent years, a large-capacity magnetoresistive random access memory (MRAM) using magnetic tunnel junction (MTJ) elements attracts expectation and attention. In this kind of MRAM, lower electrodes are provided on a base substrate, where switching transistors are formed, and MTJ elements are provided on the respective lower electrodes. Therefore, it is necessary to sufficiently secure contact areas for connection between the lower electrodes and the MTJ elements and between the lower electrodes and the transistors.

BRIEF DESCRIPTION OF THE DRAWINGS

FIG. 4 is a plan view illustrating how elements are arranged to constitute a magnetoresistive memory device in a second embodiment.

FIGS. 5A and 5B are sectional views, each illustrating how the elements are arranged to constitute the magnetoresistive memory device in the second embodiment.

DETAILED DESCRIPTION

In general, according to one embodiment, a magnetoresistive memory device comprises: first electrodes located in an interlayer insulating film; second electrodes located on the respective first electrodes within the interlayer insulating film; magnetoresistive effect elements on the respective second electrodes; and third electrodes on the respective magnetoresistive effect elements; and wherein the first electrodes and the second electrodes are displaced from each other.

Now, embodiments will be explained below with reference to the drawings.

First Embodiment

Figure 1:
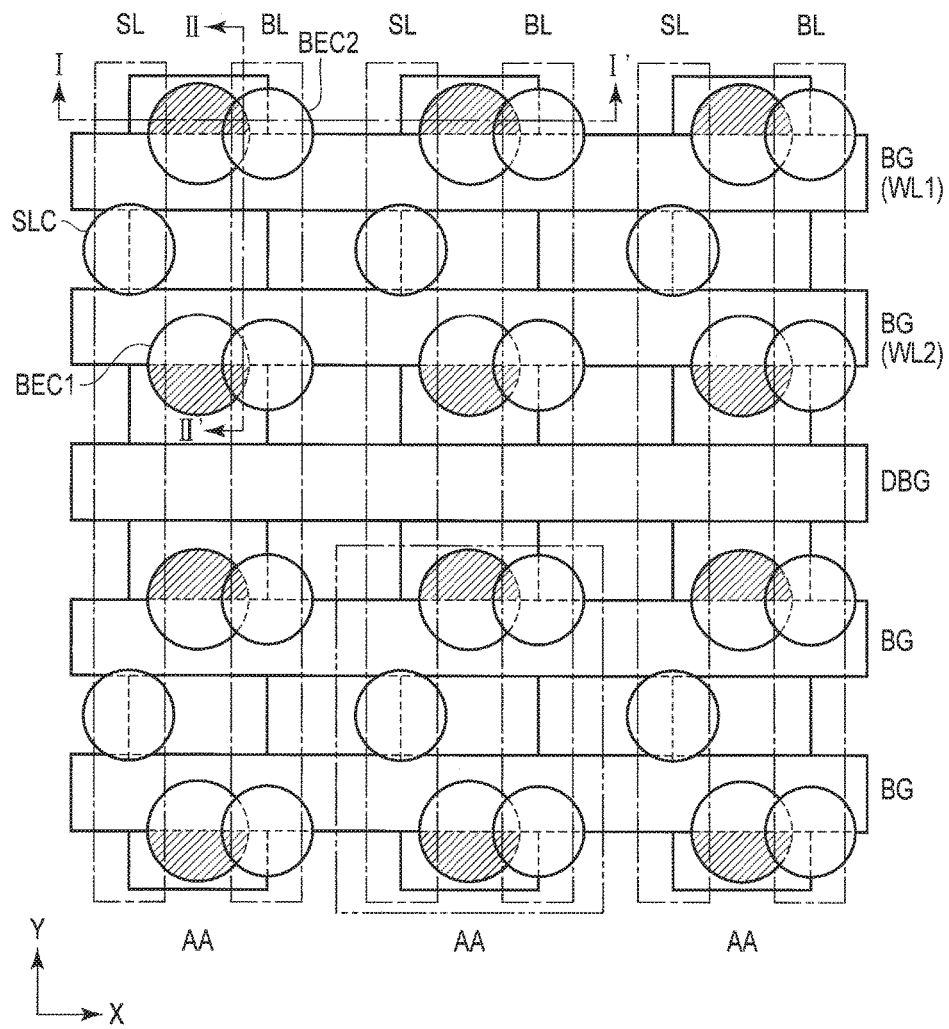
FIG. 1 is a plan view illustrating how elements are arranged to constitute a magnetoresistive memory device in a first embodiment.
Figure 2B:
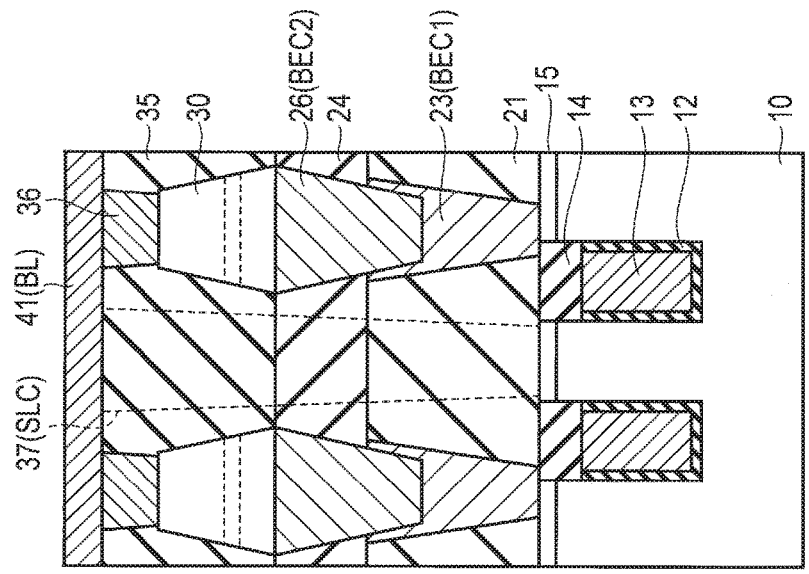
FIGS. 2A and 2B are sectional views, each illustrating how the elements are arranged to constitute the magnetoresistive memory device in the first embodiment.
Figure 2A:
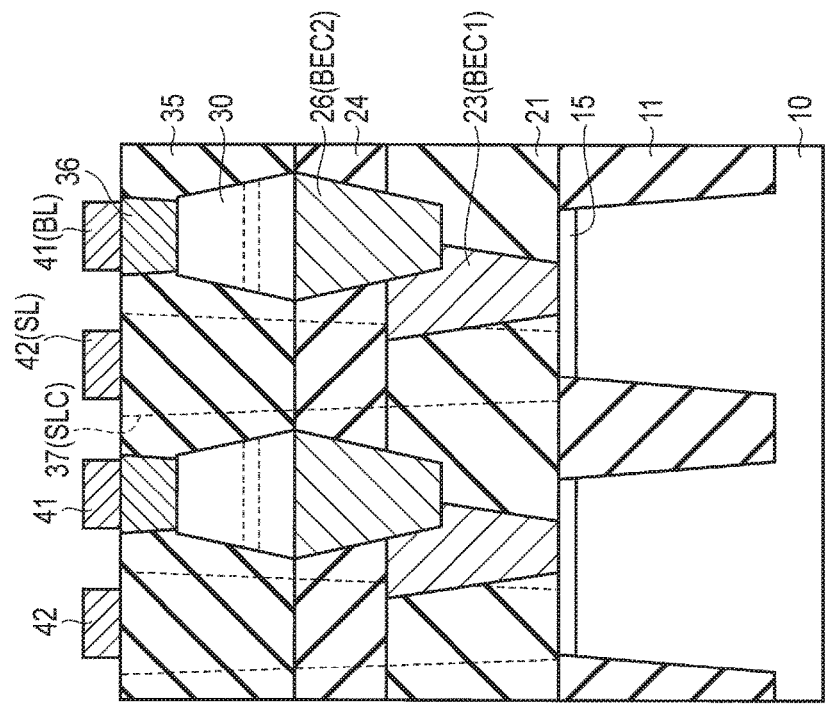
Figure 3:
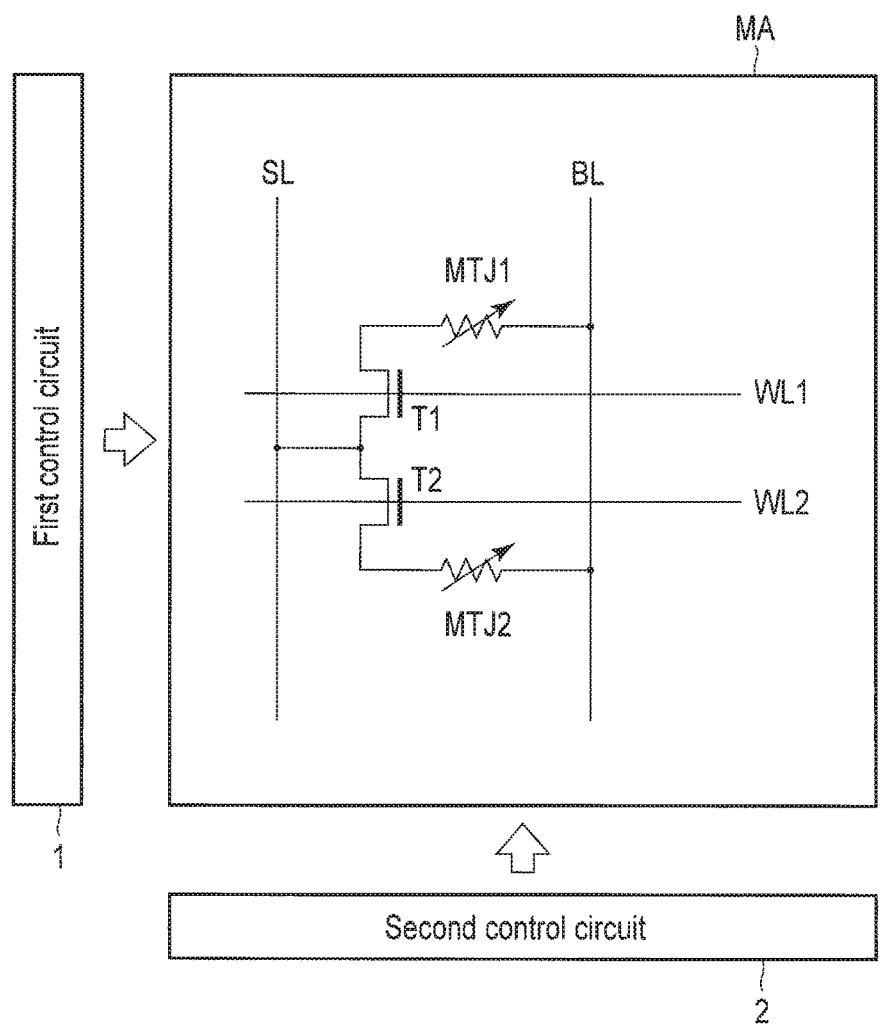
FIG. 3 is a circuit configuration view illustrating an element connection relationship of the magnetoresistive memory device in the first embodiment.

FIG. 1, FIGS. 2A and 2B, and FIG. 3 are views for explaining a magnetoresistive memory device in a first embodiment. FIG. 1 is a plan view illustrating how elements are arranged. It specifically illustrates active areas AA, embedded gates BG, various interconnect lines BL and SL, and various contacts SLC, BEC1, and BEC2. FIGS. 2A and 2B are sectional views, each illustrating how the elements are arranged. FIG. 2A is a sectional view taken along line I-I' of FIG. 1. FIG. 2B is a sectional view taken along line II-II' of FIG. 1. FIG. 3 is a circuit configuration view illustrating the connection relationship of the elements.

As illustrated in FIG. 1, a semiconductor substrate has a surface section where active areas AA are formed like islands. The active areas AA, each having a shape of a rectangle extending along a y-axis, are arranged at regular intervals along an x-axis. It should be noted that each active area AA in the surface section of the semiconductor substrate extends along the y-axis, and is separated by isolation regions.

Embedded gates BG extending along the x-axis are formed to perpendicularly intersect the active areas AA. The embedded gates BG are arranged along the y-axis at regular intervals. Each active area AA crossing each embedded gate BG provides each side of each embedded gate BG with either a source area or a drain area for a corresponding one of the transistors at the respective crossing regions. Moreover, each of the source area and the drain area constitutes a landing-plug contact (LPC) which is connected with a contact plug. Furthermore, there are dummy embedded gates DBG, which do not function as gates, at a ratio of one to three in the embedded gates BG.

Bit lines BL and source lines SL are formed to extend along the y-axis and to perpendicularly intersect the embedded gates BG. The bit lines BL and the source lines SL are alternately arranged in parallel at regular intervals. The bit lines BL and the source lines SL are arranged in such a manner that every active area AA has one bit line BL and one source line SL.

MTJ elements, which are magnetoresistive effect elements (not illustrated), and second lower electrodes (second electrodes) BEC2 are provided in such a manner that any one of the MTJ elements and a corresponding one of the second lower electrodes BEC2 may be located directly under a corresponding one of the bit lines BL. Source line contacts SLC are provided to be located directly under the respective source lines SL. Here, each of the MTJ elements in the present embodiment has a lower electrode which comprises two layers, one an underside first lower electrode (first electrodes) BEC1 and the other a topside second lower electrode BEC2. Furthermore, electrodes BEC1 and BEC2 are approximately round in sectional shape.

Each of the first lower electrodes BEC1 is not provided in the same position as a corresponding one of the second lower electrodes BEC2, but is provided in a position which deviates along the x-axis from the corresponding one of the second lower electrodes BEC2. Namely, each of the first lower electrodes BEC1 is arranged to deviate from the installation position of a corresponding one of the MTJ elements along an axis which perpendicularly intersects a corresponding one of the bit lines BL. Specifically, each of the first lower electrodes BEC1 is provided to be about halfway between a corresponding one of the bit lines BL and a corresponding one of the source lines SL so that an area overlapping with a corresponding one of the active areas AA may be large.

It is desirable that every first lower electrode BEC1 has a sufficiently large contact area in order for every first lower electrode BEC1 to be in secure contact with a corresponding one of the LPC. However, if any first lower electrode BEC1 greatly shifts its position to obtain a sufficiently large contact area to make secure contact with a corresponding one of the LPC, then it may not at all overlap with a corresponding one of the second lower electrodes BEC2. This means that a disconnection has occurred at a certain lower electrode. It is apparent that a contact area having a certain size is required for every first lower electrode BEC1 to keep in contact with a corresponding one of the second lower electrodes BEC2. Altogether, what is necessary to solve the above conundrum is to shift the position of each of the first lower electrodes BEC1 in such a manner that an overlap between the first lower electrode BEC1 concerned and a corresponding one of the second lower electrodes BEC2 should be greater than a prescribed range and that a contact area, where the first lower electrode BEC1 concerned and a corresponding one of the LPC are in contact with each other, should be as large as possible.

As illustrated in FIGS. 2A and 2B, a semiconductor substrate 10, such as a Si substrate, has a surface section where element isolation regions 11 comprising shallow trench isolation (STI) regions are provided. The surface section of the semiconductor substrate 10 is divided into two or more active areas AA by the element isolation regions 11.

MOS transistors for switching are formed in the surface section of the semiconductor substrate 10. The MOS transistors are covered with a first interlayer insulating film 21, such as a $SiO_2$ film. Each of the transistors has an embedded gate structure in which a gate electrode 13 is embedded in one of the grooves provided in the semiconductor substrate 10 with a gate insulating film 12 interposed between the gate electrode 13 and the groove. Each of the gate electrodes 13 is embedded halfway in a corresponding one of the grooves, and is covered with a corresponding one of the protective insulating films 14, such as SiN films. Furthermore, each source or drain area 15 is formed by diffusing p- or n-type impurities in one of two sides of each of the embedded gate structures in the semiconductor substrate 10.

It should be noted that the transistor sections are not restricted in configuration to those that have embedded gate structures. It is possible, for instance, that the transistor sections may have such a configuration that a gate insulating film spreads over the surface of the semiconductor substrate 10 and gate electrodes are formed on the gate insulating film. Any configuration may be applicable to a transistor section so long as the transistor section functions as a switching element.

First contact holes, each for achieving connection with the drain of a corresponding one of the transistors, are formed in the first interlayer insulating film 21. Underside first lower electrodes (BEC1) 23 are formed to fill the respective first contact holes. The underside first lower electrodes 23 are arranged in such a manner that each of the underside first lower electrodes 23 should have a sufficient contact area to make contact with the drain of a corresponding one of the transistors. That is, the underside first lower electrodes 23 are not arranged directly under the respective MTJ elements but are arranged in such a manner that each of the underside first lower electrodes 23 will be displaced toward the inner side of a corresponding one of the active areas AA, as illustrated in FIG. 1.

It is desirable that the first lower electrodes 23 should be made of a metal material that is low contact resistance with an LPC constituting the source or drain area of a transistor. By way of example, the first lower electrodes 23 may be formed by spreading TiN, which is used as a barrier metal, over the bottom and inner wall of every one of the contact holes, and filling every contact hole with W.

A second interlayer insulating film 24 is formed on the substrate where the first lower electrodes 23 are formed. Second contact holes for achieving connection with the first lower electrodes 23 are formed in the second interlayer insulating film 24. The lowermost part of any of the second contact holes is lower than the upper surface of a corresponding one of the first lower electrodes 23. Topside second lower electrodes (BEC2) 26 are embedded in the respective second contact holes.

Any material may be used for the second lower electrodes 26, so long as the used material improves the characteristics of the MTJ elements formed on the respective second lower electrodes. By way of example, the second lower electrodes 26 are formed by embedding TiN in every contact hole, and covering the surface of each embedded material with Ta.

It should be noted that the second lower electrodes 26 are provided according to the arrangement of the bit lines BL. As a result, the second lower electrodes 26 will deviate a little from their respective first lower electrodes 23. However, each of the second lower electrodes 26 will not only be kept at a portion of its under surface in sure contact with a portion of the upper surface of a corresponding one of the first lower electrodes 23 but also be kept at a portion of its side surface in sure contact with a portion of the side surface of the corresponding one of the first lower electrodes 23. Therefore, a sufficiently large contact area will be securely obtained for connection between any one of the first lower electrodes 23 and a corresponding one of the second lower electrodes 26, so that connection resistance caused by their connection will be kept sufficiently low.

Note that usable examples of the material for the electrodes 23 and 26 are Ta, W, TiN and TaN.

MTJ elements 30, which are magnetoresistive effect elements, are provided on the respective second lower electrodes 26. Each of the MTJ elements 30 has a stacked layer structure in which a nonmagnetic layer, such as an MgO layer, is between two magnetic layers, such as CoFeB layers. One of the magnetic layers is a storage layer which is variable in the direction of magnetization. The other of the magnetic layers is a reference layer which is fixed in the direction of magnetization. The nonmagnetic layer is a tunnel barrier layer for causing a tunnel current to flow. Not only CoFeB but also various kinds of magnetic substances such as FeB and CoB may be used for storage layers. Various kinds of magnetic substances such as CoPt, CoNi and CoPd can be used for the reference layer. Moreover, a material for a tunnel barrier layer is not restricted to MgO. It is possible to use an oxide including Si, Ba, Ca, La, Mn, Zn, Hf, Ta, Ti, B, Cu, Cr, V, or Al.

The configuration of an MTJ element 30 is not restricted to what has been mentioned above, but may be suitably changed.

For example, it is possible to add a shift adjustment layer for suppressing leakage of a magnetic field from a reference layer. As in the case of the reference layer, magnetic substances such as CoPt, CoNi and CoPd can be used for the shift adjustment layer. Further, for example, a layered film, such as a film of Co/Pt, Fe/Pt, Co/Pd, or Co/Ni, may as well be used for the shift adjustment layer. Moreover, it is possible to form a protective insulating film, such as an SiN film, on the side wall surface of each of the MTJ elements 30 in order to protect each of the MTJ elements 30.

A third interlayer insulating film 35 extends over the substrate where the MTJ elements 30 are formed. The upper electrodes (TEC: third electrodes) 36 connected to the respective MTJ elements 30 are embedded in the third interlayer insulating film 35. Moreover, contact holes which pass through all of the first to the third interlayer insulating film 21, 24, and 35, and reach the respective sources of the transistors are formed. The source line contacts (SLC) 37 are embedded in the respective contact holes.

The third interlayer insulating film 35 has on it bit lines (BL) 41, each connecting some of the upper electrodes 36 together, and source lines (SL) 42, each connecting some of the source line contacts 37 together.

The present embodiment having the above configuration constitutes a circuit illustrated in FIG. 3. FIG. 3 illustrates a circuit configuration of the section which is illustrated as enclosed with a two-dot chain line in FIG. 1. Namely, what is illustrated in FIG. 3 is two MTJ elements and two transistors T.

In FIG. 3, a memory cell array MA includes two memory cells, each having a series connection object comprising an MTJ element for a magnetic storage element and a switch element (for example, a field-effect transistor [FET]) T. The series connection object has two terminals, one of which (is constituted by one terminal of the MTJ element and) is electrically connected to a bit line BL and the other of which (is constituted by one terminal of the switch element T and) is electrically connected to a source line SL.

The switch element T has a control terminal, which is, for instance, a gate electrode in the case where the switch element is an FET. The control terminal of the switch element T is electrically connected to one of the word lines WL. A first control circuit 1 controls the word line WL in respect of potential. A second control circuit 2 controls the bit line BL and the source line SL in respect of potential.

In this way, in the present embodiment, any lower electrode which connects an MTJ element 30 with a MOS transistor T for use in switching has a two-layer structure, in which one layer is an underside first lower electrode (BEC1) 23 and the other layer is a topside second lower electrode (BEC2) 26. The first lower electrode 23 is arranged to be in sufficient contact with the drain of the transistor without regard to how the bit line 41 and the MTJ element 30 are arranged. Therefore, an area sufficiently large will be secured for connection between the first lower electrode 23 and the drain of the transistor T. Furthermore, the second lower electrode 26 is in contact with the first lower electrode 23 through not only its under surface but also its side surface. Therefore, even if a first lower electrode 23 and a corresponding one of the second lower electrodes 26 somewhat deviate from each other in position, the contact area between the first lower electrode 23 and the second lower electrode 26 will be fully secured.

As illustrated in FIG. 1 by hatching, the contact area of any one of the first lower electrodes 23 and a corresponding one of the LPC will be about half of the cross section of the concerned one of the first lower electrodes 23. On the other hand, when any one of the first lower electrodes 23 is arranged as before at the same position as a corresponding one of the second lower electrodes 26, the contact area between the concerned one of the first lower electrodes 23 and a corresponding one of the LPC will be about ¼ of the cross section of the concerned one of the first lower electrodes 23.

Therefore, adoption of the configuration of the present embodiment makes the contact area between a first lower electrode 23 and a corresponding LPC increase twice in comparison with the conventional configuration. Accordingly, the connection resistance between an MTJ element 30 and a corresponding transistor T will be lowered, and thus improvement in element characteristics will be achieved.

Second Embodiment

FIG. 4 is a plan view illustrating how elements are arranged to constitute a magnetoresistive memory device in a second embodiment. FIGS. 5A and 5B are sectional views, each illustrating how the elements are arranged to constitute the magnetoresistive memory device in the second embodiment. FIG. 5A is a sectional view taken along line I-I' of FIG. 4. FIG. 5B is a sectional view taken along line II-II' of FIG. 4. It should be, noted that the same portions as those of FIG. 1 or FIG. 2 are given the same numbers as those of FIG. 1 or FIG. 2, and their detailed explanations will be omitted.

The point that the present embodiment is different from the previously described first embodiment is the depth-wise length of the second lower electrodes 26. That is, the under surface of any of the second lower electrodes 26 has reached the drain of a corresponding one of the switching MOS transistors.

The present embodiment may be implemented as follows. First of all, first lower electrodes 23 and a first interlayer insulating film 24 are formed. Then, second contact holes are formed in such a manner that the lower part of each of the second contact holes reaches the surface of the substrate. The second lower electrodes 26 are formed in the respective second contact holes in such a manner that each of the second lower electrodes 26 touches at its side a corresponding one of the first lower electrodes 23 and at its under surface the drain of a corresponding one of the transistors.

Therefore, the contact area among any one of the first lower electrodes 23, a corresponding one of the second lower electrodes 26, and a corresponding one of the LPC will increase in comparison with the first embodiment, as apparent from the hatching in FIG. 4. Specifically, the contact area where any one of the lower electrodes 23, a corresponding one of the lower electrodes 26, and a corresponding one of the LPC are in contact with one another will increase in comparison with the first embodiment by such an amount corresponding to one fourth of the cross section of any one of the second lower electrodes 26.

In this way, the present embodiment makes it possible to increase the contact area, where any one of the lower electrodes 23, a corresponding one of the lower electrodes 26, and a corresponding one of the transistors are in contact with one another, only by making the second lower electrodes 26 reach the substrate 10. Furthermore, the contact area between any one of the first lower electrodes 23 and the side of a corresponding one of the second lower electrodes 26 may be increased. Therefore, a further reduction in connection resistance between any one of the MTJ elements 30 and a corresponding one of the transistors will be achieved, resulting in further improvement in element characteristics.

Third Embodiment

Figure 6:
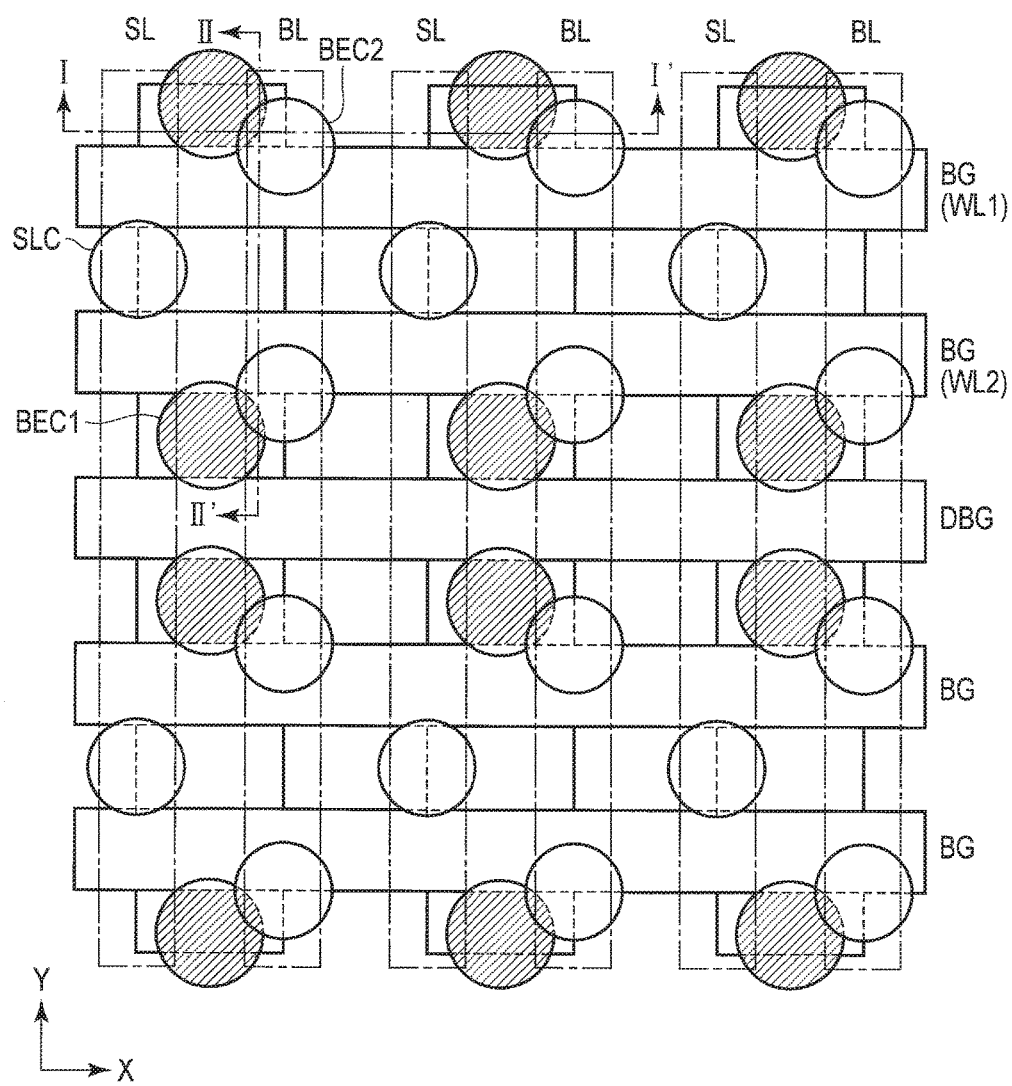
FIG. 6 is a plan view illustrating how elements are arranged to constitute a magnetoresistive memory device in a third embodiment.
Figure 7A:
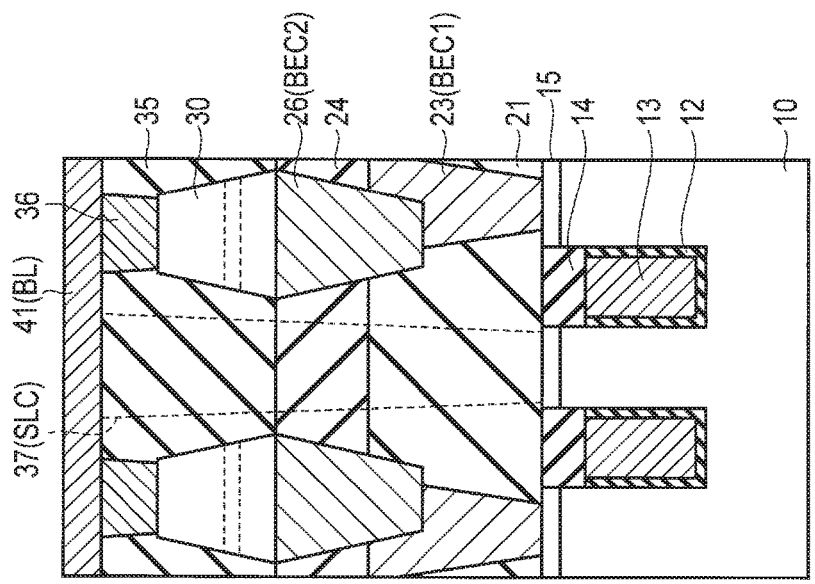
FIGS. 7A and 7B are sectional views, each illustrating how the elements are arranged to constitute the magnetoresistive memory device in the third embodiment.
Figure 7B:
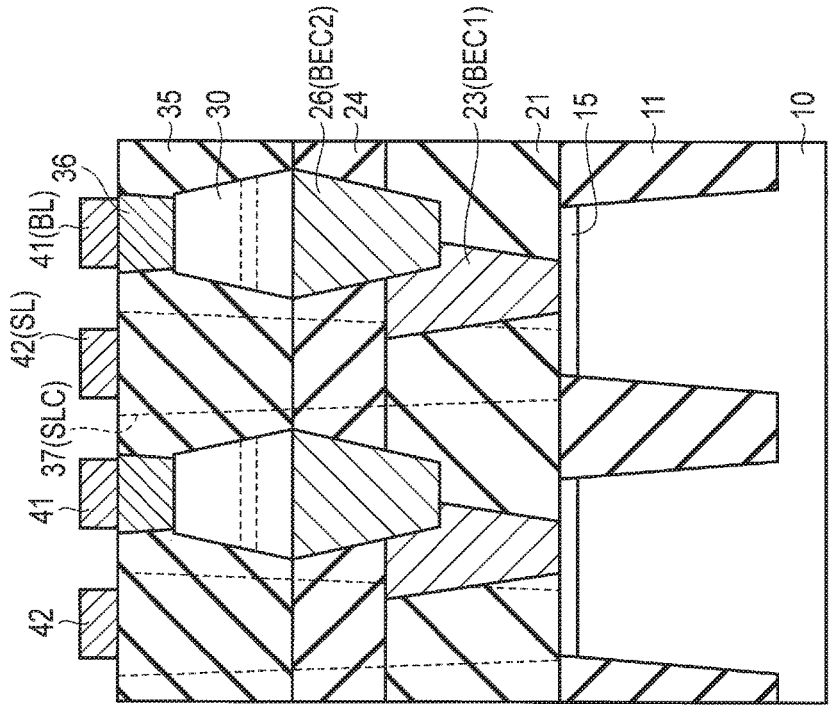

FIG. 6 is a plan view illustrating how elements are arranged to constitute a magnetoresistive memory device in a third embodiment. FIGS. 7A and 7B are sectional views, each illustrating how the elements are arranged to constitute the magnetoresistive memory device in the third embodiment. FIG. 7A is a sectional view taken along line I-I' of FIG. 6. FIG. 7B is a sectional view taken along line II-II' of FIG. 6. It should be noted that the same portions as those of FIG. 1 or FIG. 2 are given the same numbers as those of FIG. 1 or FIG. 2, and their detailed explanations will be omitted.

The present embodiment is different from the previous first embodiment in that first lower electrodes (BEC1) 23 shift along not only the x-axis but also the y-axis. Namely, the first lower electrodes 23 are arranged in such a manner that each of the first lower electrodes 23 deviates from the installation position of a corresponding one of the MTJ elements 30 along a corresponding one of the bit lines BL and an imaginary line that perpendicularly intersects the bit lines. More specifically, the first lower electrodes 23 are arranged along the y-axis in such a manner that each of them is located at an intermediate position between any two adjacent embedded gates BG.

Such a configuration makes it possible to further increase the contact area between any one of the first lower electrodes 23 and a corresponding one of the LPC, as apparent from the hatching in FIG. 6. Specifically, the contact area between any one of the first lower electrodes 23 and a corresponding one of the LPC will increase twofold in comparison with the first embodiment.

Furthermore, since the first lower electrodes 23 deviate in position from the second lower electrodes 26 as apparent from the cross-section illustrated in FIG. 7A, the overlapping area between any one of the first lower electrodes 23 and a corresponding one of the second lower electrodes 26 will decrease a lot in comparison with the first embodiment. However, any one of the first lower electrodes 23 and a corresponding one of the second lower electrodes 26 are connected with each other at their respective sides, so that a sufficiently wide contact area will be secured.

In this way, each of the first lower electrodes 23 deviates along not only the x-axis but also the y-axis in the present embodiment to secure a sufficiently large contact area with which the drain of a corresponding one of the transistors may be in contact. Therefore, the further reduction of the series resistance in the lower electrodes 23 and 26 will be promoted.

Fourth Embodiment

Now, a manufacturing method of manufacturing magnetoresistive memory devices in the previous first embodiment will be explained as a fourth embodiment.

FIGS. 8A and 8B to FIGS. 13A and 13B are sectional views for illustrating a magnetoresistive memory device manufacturing process in a fourth embodiment. FIG. 8A to FIG. 13A are equivalent to the I-I' cross-section of FIG. 1. FIG. 8B to FIG. 13B are equivalent to the II-II' cross-section of FIG. 1.

Figure 8A:
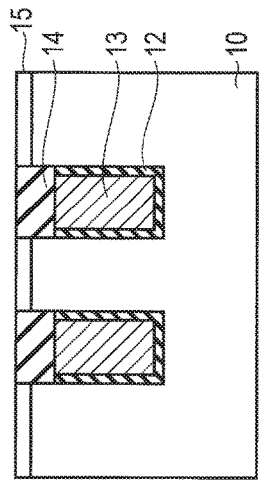
FIGS. 8A and 8B are sectional views illustrating a magnetoresistive memory device manufacturing process in a fourth embodiment.
Figure 8B:
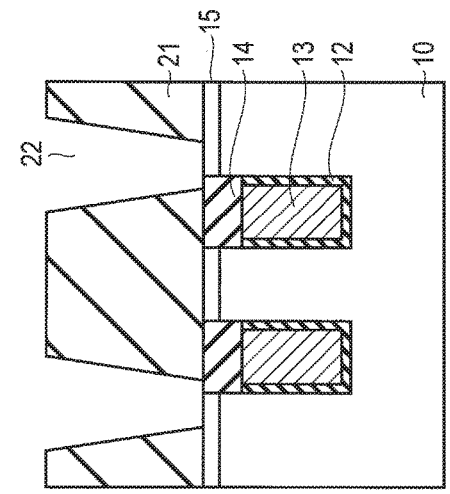

First of all, as illustrated in FIGS. 8A and 8B, trenches for isolating elements from one another are formed in a semiconductor substrate 10, such as a Si substrate, and isolation regions 11 are formed by filling the trenches with an insulating layer of $SiO_2$, etc. Subsequently, grooves for embedded gates are formed in the surface section of the semiconductor substrate 10. The grooves are coated with respective remaining portions of a gate insulating film 12, and are halfway filled with respective gate electrodes 13. Here, the gate electrodes 13 extend to the halfway of the respective grooves, and are covered with respective remaining portions of a protective insulating film 14, such as an SiN film. Source/drain areas (LPC) are formed by diffusing p- or n-type impurities in the surface section of the substrate 10. In this way, switching MOS transistors each having an embedded gate structure will be obtained.

Figure 9A:
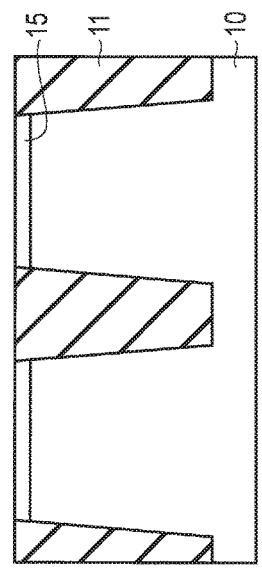
FIGS. 9A and 9B are sectional views illustrating a magnetoresistive memory device manufacturing process in a fourth embodiment.
Figure 9B:
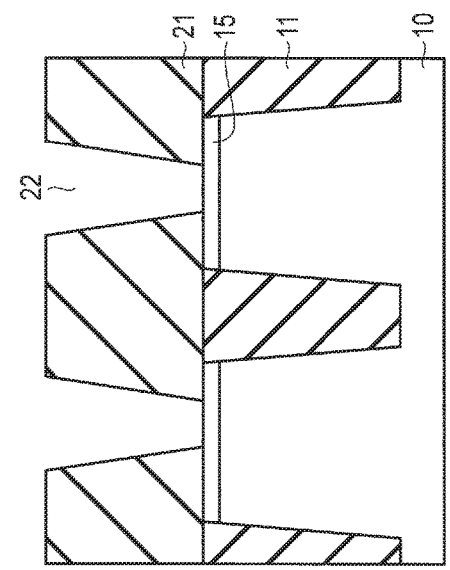

Subsequently, as illustrated in FIGS. 9A and 9B, a first interlayer insulating film 21 of $SiO_2$, etc., is formed with a CVD method or the like on the substrate 10 where the transistors have been formed. Then, first contact holes 22, each allowing connection with the drain of a corresponding one of the transistors, are formed by an RIE method, etc., in the first interlayer insulating film 21. Here, the contact holes 22 are formed in their respective positions, each deviating from the installation position of a corresponding one of the MTJ elements along the axis which perpendicularly intersects a corresponding one of the bit lines BL in the same way as the first embodiment.

Figure 10A:
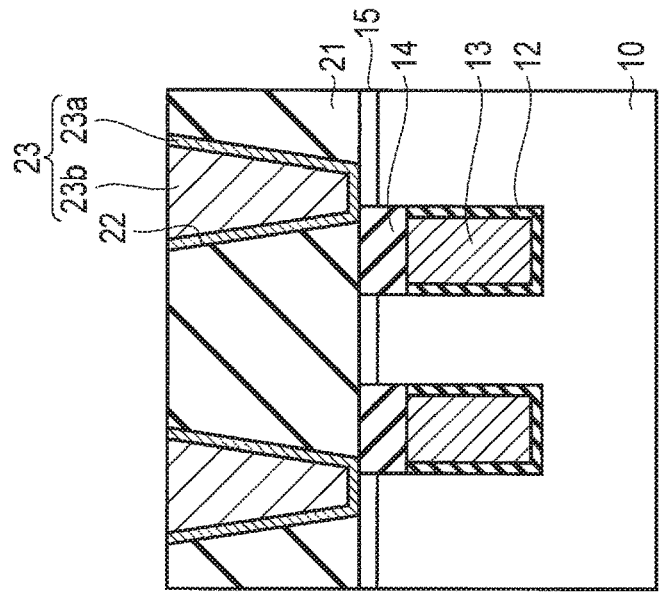
FIGS. 10A and 10B are sectional views illustrating a magnetoresistive memory device manufacturing process in a fourth embodiment.
Figure 10B:
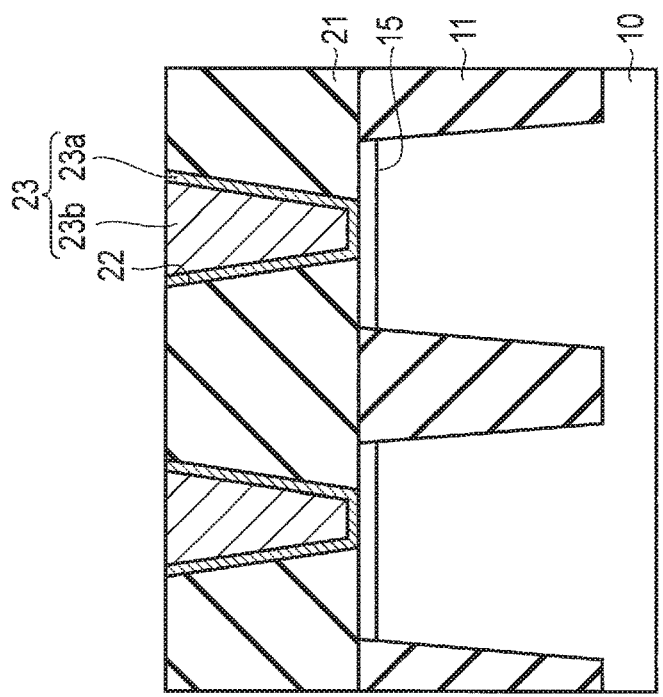

Subsequently, as illustrated in FIGS. 10A and 10B, a TiN film 23a is formed as a barrier metal to cover the bottom and side wall of each of the contact holes 22, and a W film 23b is formed as a contact plug to fill the inner side of each of the contact holes 22. The TiN film 23a and the W film 23b may be formed by using a sputtering method, for example. All that is necessary to embed a metallic body in each and every contact hole 22 is first to deposit a metallic film on an interlayer insulating film 21 by a sputtering method, etc., in such a manner that the metallic film not only covers the interlayer insulating film 21 but also fills each and every contact hole 22, and then to remove the metallic film that is on the interlayer insulating film 21 by chemical mechanical polishing (CMP) with leaving those portions of the metallic film that fill the respective holes.

Figure 11B:
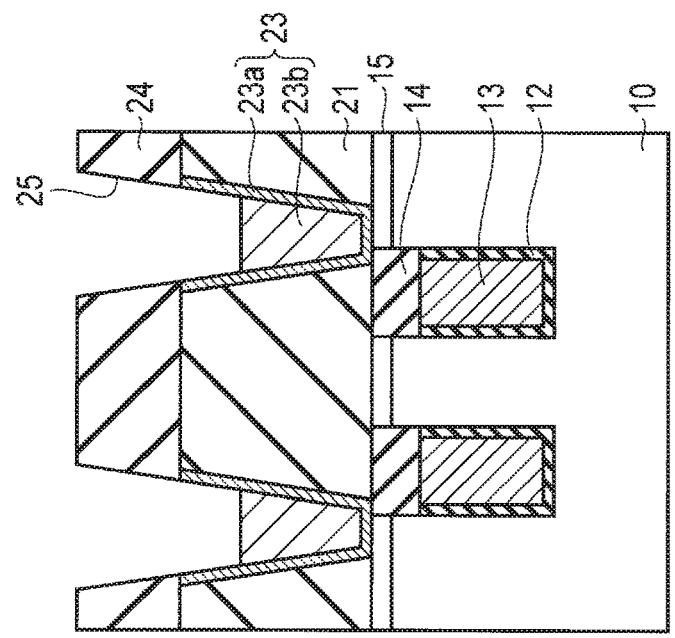
FIGS. 11A and 11B are sectional views illustrating a magnetoresistive memory device manufacturing process in a fourth embodiment.
Figure 11A:
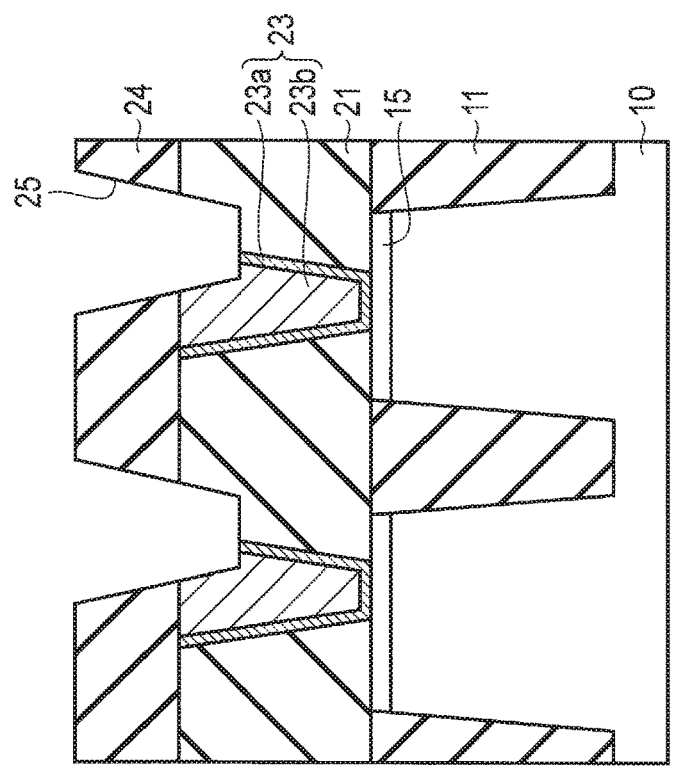

Subsequently, as illustrated in FIGS. 11A and 11B, a second interlayer insulating film 24 of $SiO_2$, etc., is formed with a CVD method or the like. Then, second contact holes 25, each allowing connection with a corresponding one of the first lower electrodes 23, are formed by an RIE method, etc., in the second interlayer insulating film 24. Here, each of the second contact holes 25 is formed according to the installation position of a corresponding one of the MTJ elements in the same way as the above-explained first embodiment. The lowermost part of each of the second contact holes 25 should be located below the uppermost surface of the first lower electrode 23.

Figure 12A:
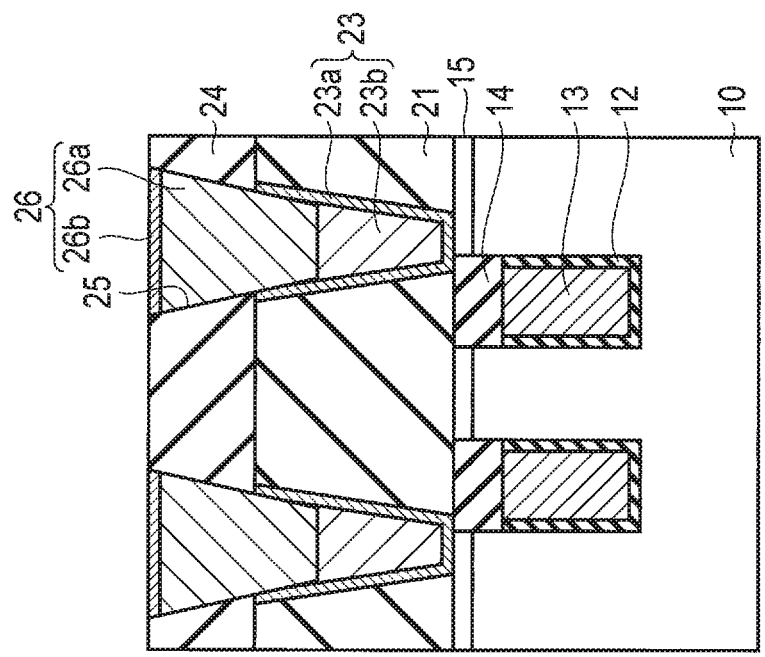
FIGS. 12A and 12B are sectional views illustrating a magnetoresistive memory device manufacturing process in a fourth embodiment.
Figure 12B:
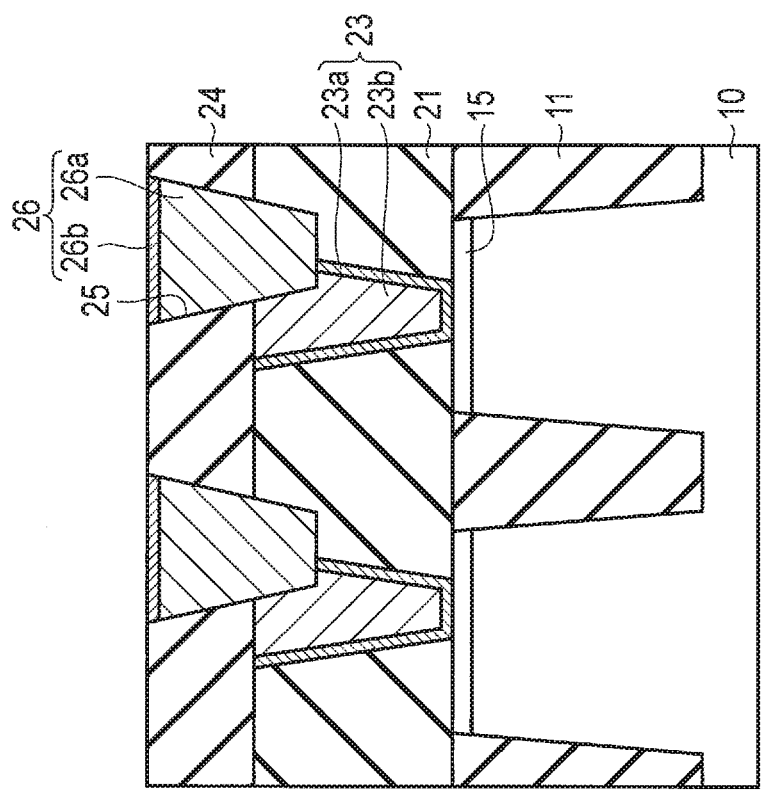

Subsequently, as illustrated in FIGS. 12A and 12B, those portions of a TiN film 26a that remain in the respective second contact holes 25 constitute embedded contact plugs which are covered with those portions of a Ta film 26b that are left on the respective portions of the TiN film 26a. A sputtering method may be used for forming the TiN film 26a and the Ta film, for example.

Figure 13A:
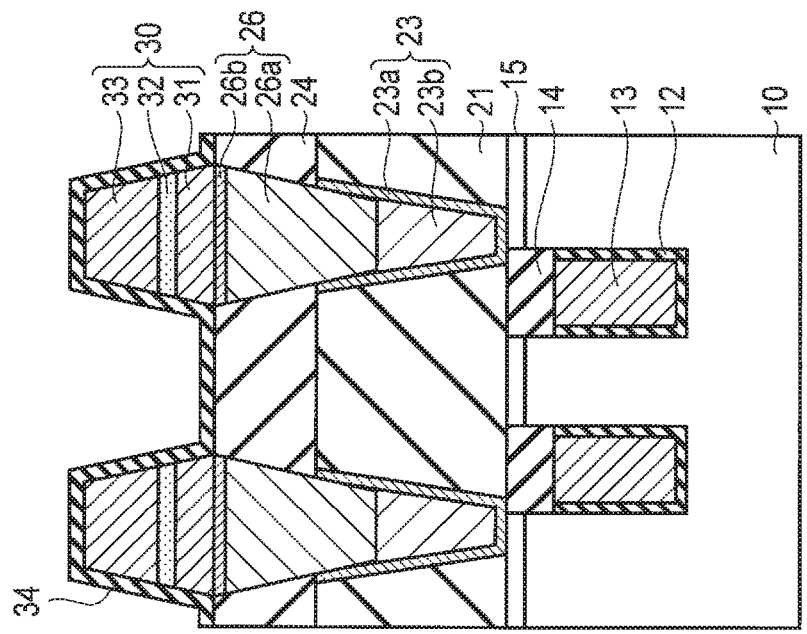
FIGS. 13A and 13B are sectional views illustrating a magnetoresistive memory device manufacturing process in a fourth embodiment.
Figure 13B:
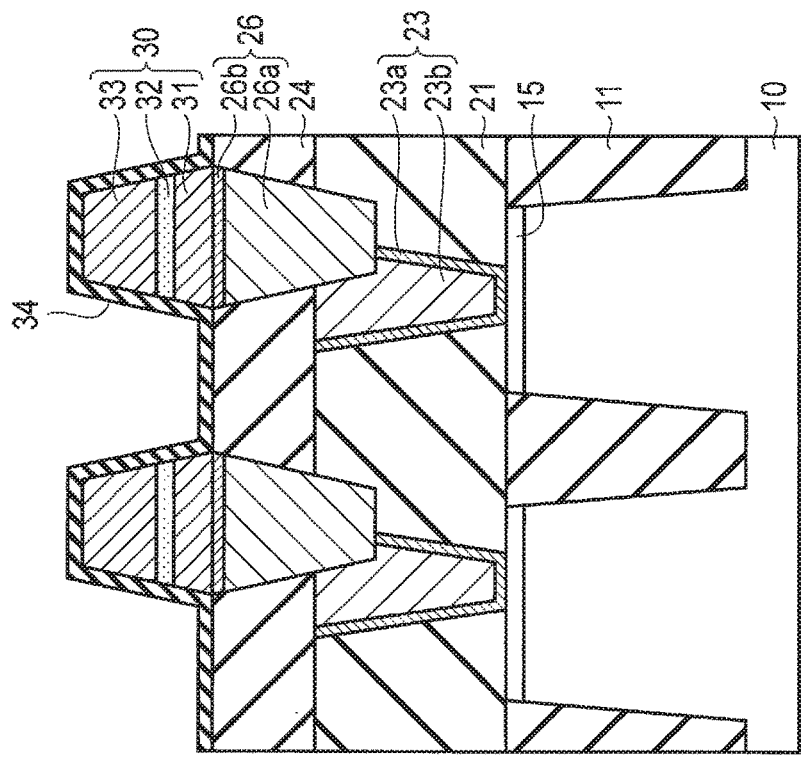

Subsequently, as illustrated in FIGS. 13A and 13B, a layered body comprising a magnetic layer 31, a nonmagnetic layer 32, and a magnetic layer 33 is formed on the second interlayer insulating film 24 for production of MTJ elements, and is processed into element patterns by an ion-beam etching method to form MTJ elements 30. That is, each of the produced MTJ elements 30 has a lamination structure in which a nonmagnetic layer 32 is between magnetic layers 31 and 32. Then, a protective insulating film 34 of SiN or the like is formed on the interlayer insulating film 24 to cover the MTJ elements 30.

In each MTJ element 30, the first magnetic layer 31 is a storage layer which is variable in magnetization direction. For example, CoFeB is used for the first magnetic layer 31. The nonmagnetic layer 32 is a tunnel barrier layer. For example, MgO is used for the nonmagnetic layer 32. The second magnetic layer 33 is a reference layer which is fixed in magnetization direction. For example, CoPt is used for the second magnetic layer 32. The configuration of an MTJ element 30 is not restricted to the above, but it is possible to provide a shift adjustment layer.

Subsequently, a third interlayer insulating film 35 is formed. Then, upper electrodes 36, each allowing connection with a corresponding one of the MTJ elements 30, are embedded. Furthermore, source line contacts 37, each allowing connection with the source of a corresponding one of the transistors, are embedded. Then, bit lines 41 and source lines 42 are formed. The configuration illustrated in FIG. 2A or FIG. 2B will be obtained.

As has been explained above, the present embodiment makes it possible to reduce connection resistance between each of the MTJ elements 30 and a corresponding one of the transistors T with the use of a general manufacturing process only by somewhat shifting first contact holes 22 and forming second contact holes 25 in such a manner that each second contact hole will be deeper than the upper surface of a corresponding one of the first lower electrodes 23. Therefore, manufacture of magnetoresistive memory devices excellent in element characteristics will be achieved without incurring substantial change in a manufacturing process.

(Modification)

It should be noted that the present invention is not restricted to each embodiment mentioned above.

The shift amount of each of the first lower electrodes is not restricted to what is described in each embodiment but may be suitably changed according to specifications. Specifically, what is necessary is just to make large an overlapping area between each of the first lower electrodes and a corresponding one of the LPC while keeping each of the first lower electrodes and a corresponding one of the second lower electrodes overlapping each other.

In any of the embodiments, the storage layer of an MTJ element is arranged at the substrate side. However, how to arrange the MTJ element is not restricted to such an arrangement. It is possible, for instance, to conversely arrange a storage layer and a reference layer. Accordingly, it is possible to use such a configuration that a reference layer is arranged at the substrate side and a storage layer is arranged at the other side that is opposite to the substrate. Furthermore, various kinds of change may be possible, including addition of a shift adjustment layer for control of a leakage magnetic field or addition of a buffer layer for improvement in crystallization.

Moreover, switching transistors or lower electrodes are not at all structurally restricted to those of the embodiments but may be suitably changed according to specifications. Furthermore, the sectional view of each of the lower electrodes or that of each of the MTJ elements is not necessarily restricted to a circle, but it is possible that each of the lower electrodes or each of the MTJ elements has a rectangle or a rectangular circle in their respective sectional view.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive memory device comprising:
   first electrodes located in an interlayer insulating film;
   second electrodes located on the respective first electrodes within the interlayer insulating film;
   magnetoresistive effect elements on the respective second electrodes; and
   third electrodes on the respective magnetoresistive effect elements;
   wherein the first electrodes and the second electrodes are displaced from each other, and
   wherein each of the second electrodes comprises a side surface and an under surface located as high as an under surface of a corresponding one of the first electrodes, and is connected at the side surface to the corresponding one of the first electrodes.

2. The device of claim 1, wherein each of the magnetoresistive effect elements has a stacked layer structure comprising a first magnetic layer, a second magnetic layer and a nonmagnetic layer between the first and second magnetic layers.

3. The device of claim 2, wherein the first magnetic layer is a storage layer variable in magnetization direction, the second magnetic layer is a reference layer fixed in magnetization direction, and the nonmagnetic layer is a tunnel barrier layer.

4. A magnetoresistive memory device comprising:
   a semiconductor substrate including switching transistors provided thereon;
   an interlayer insulating film on the semiconductor substrate;
   first electrodes located in the interlayer insulating film and each connected to a portion of a corresponding one of the transistors;
   second electrodes located in the interlayer insulating film and connected to the respective first electrodes;
   magnetoresistive effect elements on the respective second electrodes;
   third electrodes on the respective magnetoresistive effect elements; and
   bit lines, each connecting some of the third electrodes together,
   wherein each of the first electrodes is arranged to deviate from an installation position of a corresponding one of the magnetoresistive effect elements along an axis perpendicularly intersecting a corresponding one of the bit lines, and is connected by an under surface thereof to the portion of the corresponding one of the transistors,
   wherein each of the second electrodes is provided according to the installation position of a corresponding one of the magnetoresistive effect elements, and is arranged between the corresponding one of the magnetoresistive effect elements and a corresponding one of the first electrodes and is connected by a side surface thereof, to the corresponding one of the first electrodes, and wherein each of the second electrodes comprises an under surface that reaches a surface of the semiconductor substrate, and the under surface of each of the second electrodes is connected to a portion of a corresponding one of the transistors.

5. The device of claim 4, wherein each of the magnetoresistive effect elements has a stacked layer structure comprising a first magnetic layer, a second magnetic layer and a nonmagnetic layer between the first and second magnetic layers.

6. The device of claim 5, wherein the first magnetic layer is a storage layer variable in magnetization direction, the second magnetic layer is a reference layer fixed in magnetization direction, and the nonmagnetic layer is a tunnel barrier layer.

7. The device of claim 4, further comprising source contacts located in the interlayer insulating film, each connected to another portion of a corresponding one of the transistors.

8. The device of claim 7, wherein each of the first electrodes is connected to a drain of the corresponding one of the transistors, and each of the source contacts is connected to a source of the corresponding one of the transistors.

9. The device of claim 7, further comprising source lines, each connecting some of the source contacts together, wherein the bit lines and the source lines are alternately arranged in parallel at regular intervals.

* * * * *